Figure 1:
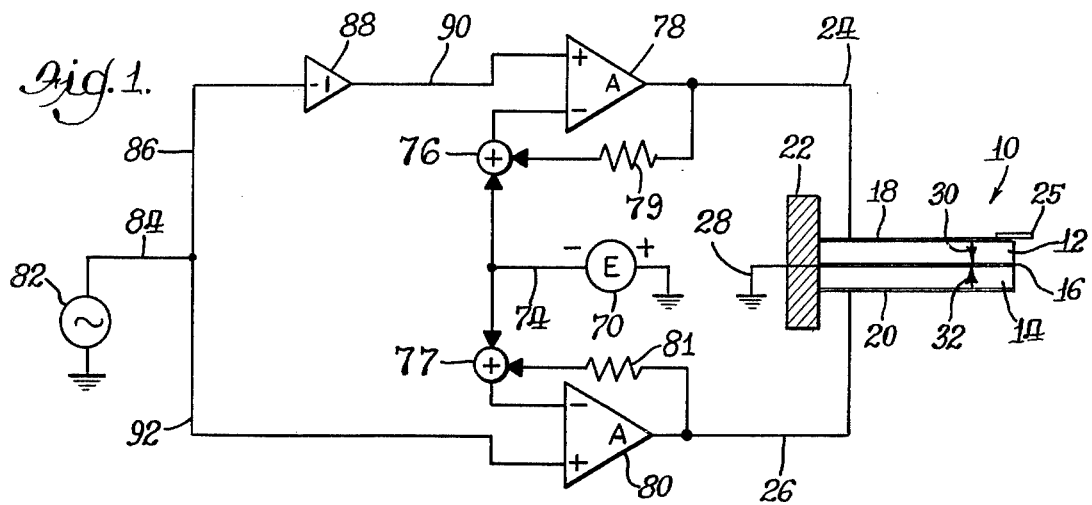

United States Patent [19]

Rodal

[11] 4,169,276
[45] Sep. 25, 1979

[54] DRIVE CIRCUIT FOR CONTROLLING A MOVABLE MAGNETIC HEAD

[75] Inventor: David R. Rodal, Palo Alto, Calif.

[73] Assignee: Ampex Corporation, Redwood City, Calif.

[21] Appl. No.: 842,470

[22] Filed: Oct. 17, 1977

[51] Int. Cl.² .................... G11B 5/52; G11B 21/10; G11B 21/18
[52] U.S. Cl. .................... 360/77; 360/107; 360/109
[58] Field of Search .................. 360/77, 75, 70, 76, 360/107–109, 104; 310/330–332, 311, 357, 351, 368, 26

[56] References Cited

U.S. PATENT DOCUMENTS

| | | | |
|---|---|---|---|
| 2,863,076 | 12/1958 | Koren et al. | 310/359 |
| 3,170,102 | 2/1965 | Hayes | 310/26 |
| 3,526,726 | 9/1970 | Corbett et al. | 360/109 |
| 3,787,616 | 1/1974 | Falk et al. | 360/75 |
| 3,958,161 | 5/1976 | Dixon | 310/359 |
| 4,080,636 | 3/1978 | Ravizza | 360/109 |
| 4,093,885 | 6/1978 | Brown | 310/331 |
| 4,099,211 | 7/1978 | Hathaway | 360/109 |
| 4,106,065 | 8/1978 | Ravizza | 360/109 |

FOREIGN PATENT DOCUMENTS

| | | | |
|---|---|---|---|
| 49-84617 | 8/1974 | Japan | 360/77 |
| 387423 | 6/1973 | U.S.S.R. | 360/75 |

OTHER PUBLICATIONS

1954 Joint Convention of Branches of Three Institutes of Electrical Engineers, p. 677, Electro-Striction Type Relay Using Barium Titanate Ceramics, Kiyoshi Abe, et al.
Charles Edmiston, Electronic Design 18, Sep. 1, 1974, pp. 78–82.

*Primary Examiner*—Alfred H. Eddleman
*Attorney, Agent, or Firm*—Robert G. Clay; Ralph L. Mossino; J. Ronald Richbourg

[57] ABSTRACT

An improved drive circuitry for controlling the deflection of a bimorph comprising a pair of electrically poled piezo-ceramic elements bonded to a common substrate is disclosed which applies deflection voltage in a manner whereby the polarity is always in the poling direction of each of the elements so that depolarization of the piezo-ceramic elements does not occur. The circuitry applies a common polarity D. C. biasing voltage to both of the piezo-ceramic elements of the bimorph and also applies oppositely phased A. C. deflection signals to the respective piezo-ceramic elements.

11 Claims, 5 Drawing Figures

DRIVE CIRCUIT FOR CONTROLLING A MOVABLE MAGNETIC HEAD

The present invention is generally directed to piezoelectric benders or bimorphs and, more particularly, to improved drive circuitry for deflecting such bimorphs in systems requiring relatively large amounts of bidirectional deflection.

As is comprehensively set forth in an application by Raymond F. Ravizza, Ser. No. 677,828, filed Apr. 16, 1976, now U.S. Pat. No. 4,106,065, for Drive Circuitry for Controlling Movable Video Head, which is assigned to the same assignee as the present invention, it is known in the art to bond together a pair of piezo-ceramic elements and to apply a deflection voltage to the elements causing them to bend or deflect along a lengthwise direction. This arrangement is known in the art as a bimorph or bender and, when such a bimorph is electrically deflected, it is generally said to be acting as a motor. Individual ceramic elements which make up the bimorph are comprised of a high dielectric constant polycrystalline material which acquires piezoelectric properties when subjected to a strong unidirectional voltage which polarizes the material according to the polarity of the applied voltage. Thus, the polarized material is said to have a "poling direction" and exhibits unique mechanical properties when it is subjected to subsequently applied voltages. As an example, if a long thin piezoelectric element has its top surface free to move and its bottom surface restricted from movement, as might occur if it is bonded to a thin dimensional stable substrate, and if a voltage is applied between the top and bottom surfaces, the element will bend.

A known method of multiplying the bending effect is to bond a piezo-ceramic element to each side of the substrate and to apply a voltage between the substrate in each element so that the voltage is in the poling direction of one element and opposed to the poling direction of the other element. A push-pull effect is achieved which causes the bonded pair of elements to bend to a greater extent than a single element. By reversing the polarity of the applied voltage, the direction in which the elements bend is also reversed.

For some applications, notably the arrangement described above wherein a deflecting voltage is applied in the poling direction of one element and opposed to the poling direction of the second element, it is satisfactory. However, when large amounts of bending are required, large deflection voltages are also necessary and it has been found that applying large voltage in a direction opposite to the poling direction of the piezo-ceramic element (i.e., of a polarity opposite to that of the original polarizing voltage) tends to depolarize the element which, through use, reduces its ability to bend or deflect.

An example of an application where large bidirectional deflections are required is in a rotary scan tape recorder where a magnetic transducer is mounted on a bimorph fixed to a rotary scanning assembly and the bimorph is deflected so that the transducer can be accurately positioned relative to a recorded track so that optimum recording or reproduction of information is achieved. The tape recorder includes electronic means for sensing the position of the head relative to the track and for aligning the transducer with the track. Such a recorder for recording and reproducing wideband television signals is disclosed in the commonly assigned copending applications by Ravizza and Wheeler, Ser. No. 669,047, entitled Automatic Scan Tracking filed on Mar. 22, 1976, now U.S. Pat. No. 4,151,570, and an application by Hathaway, Ser. No. 668,651, entitled Positionable Transducer Mounting Structure, filed Mar. 19,1976, now U.S. Pat. No. 4,151,569. In one embodiment of the recorder described in said applications, commonly referred to as a videotape recorder, a transducer is mounted at one end of a bimorph and deflection voltages are applied to the bimorph for deflecting it so as to position the transducer properly with respect to the track being scanned.

The deflection required to move a magnetic transducer in such a recorder may be about 17 mils or more, depending on the design limits of the apparatus as is discussed therein. In such cases, large deflection voltages, i.e., approaching 200 volts, may be required for application to the bimorph to accomplish the necessary deflection. If the bimorph is constructed and driven according to prior art methods, reduced deflection sensitivity results, because of the aforementioned depolarizing effect. It should therefore be appreciated that the depolarized effect is a distinct disadvantage in the environment of a videotape recorder as well as other applications where reduced deflection sensitivity is undersirable. In the previously mentioned Ravizza, U.S. Pat. No. 4,106,065, drive circuitry for controlling the deflection of a bimorph does not produce the undesirable depolarizing effect because the deflection voltages are uniquely applied in a manner whereby voltage on a particular piezo-ceramic element of the bimorph is never opposed to the poling direction.

It is an object of the present invention to provide improved and less extensive circuitry for accomplishing large amplitude bidirectional deflection of a bimorph without depolarizing either element of the bimorph.

Figure 2:
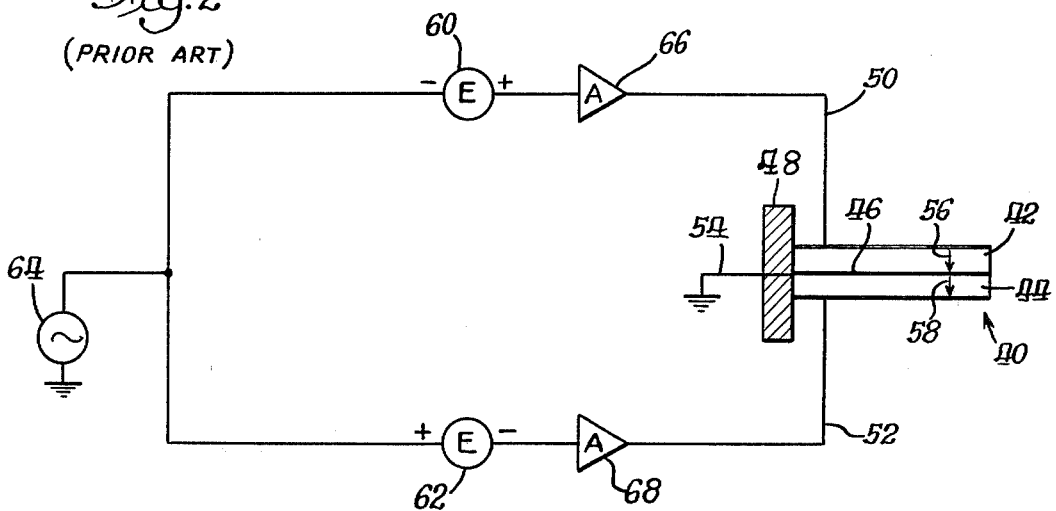
Figure 3:
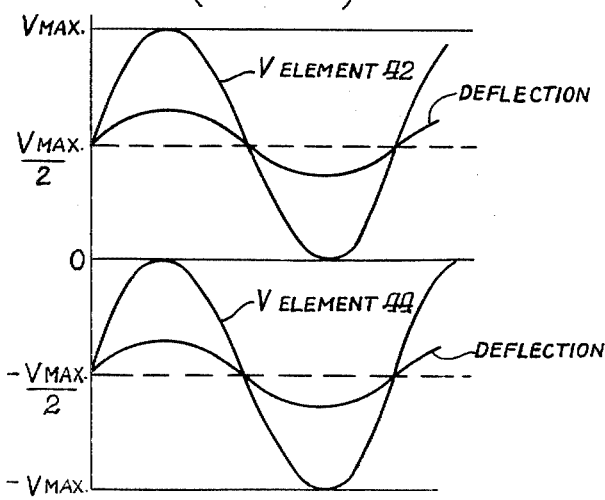
Figure 4:
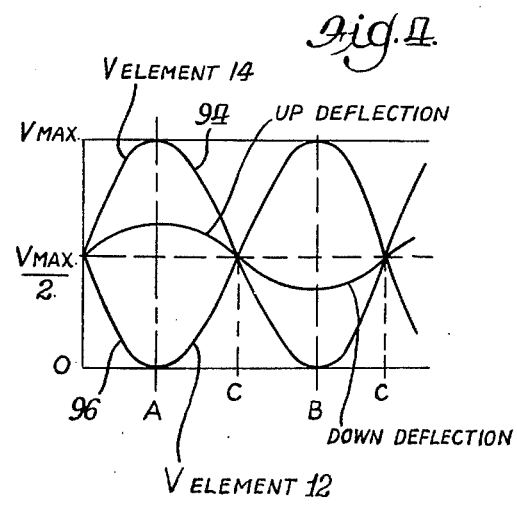
Figure 5:
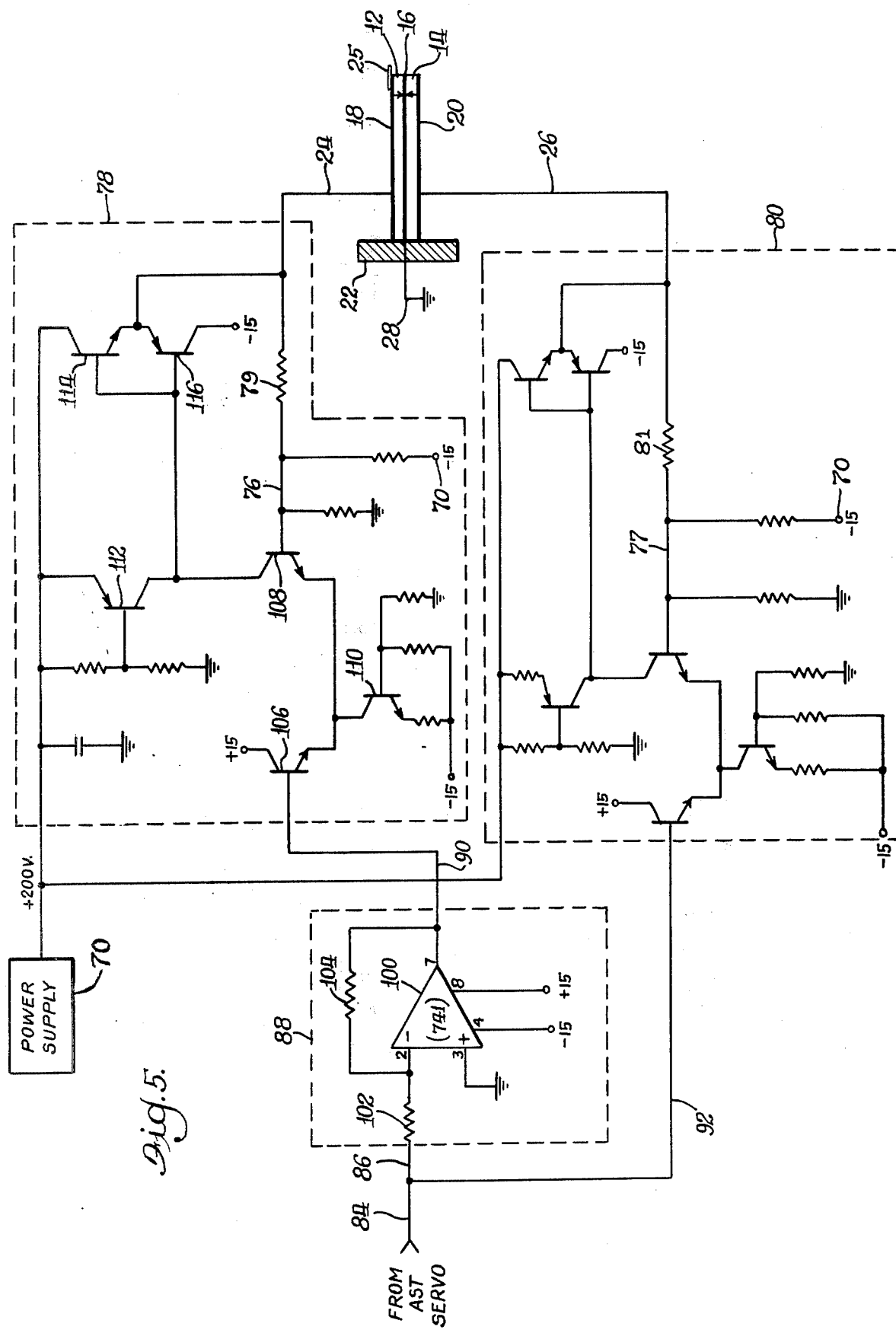

Other objects and advantages of the present invention will become apparent upon reading the following detailed description, while referring to the attached drawings, in which:

FIG. 1 is a block diagram of a drive circuit embodying the present invention that may be used to produce bidirectional deflection of a bimorph carrying a magnetic transducer assembly;

FIG. 2 shows a prior art method of deflecting a bimorph as disclosed in the aforementioned Ravizza U.S. Pat. No. 4,106,065;

FIG. 3 graphically illustrates the voltages that are applied to the elements of the bimorph shown in FIG. 2 in accordance with the prior art teachings of the aforementioned Ravizza U.S. Pat. No. 4,106,065;

FIG. 4 graphically illustrates the net voltage which is applied to the elements of the bimorph shown in FIG. 1, together with the resulting deflection that is obtained; and, FIG. 5 is an electrical schematic diagram of one specific embodiment of circuitry that can be used to carry out the operation of the block diagram shown in FIG. 1.

Broadly stated, the present invention is directed to an improved method and apparatus for reliably providing large amplitude deflection of a deflectable bimorph or bender, which deflection is achieved without experiencing undesirable depolarization of the bimorph and which can be accomplished using simpler, less expensive circuitry. The present invention avoids the undesirable depolarization by applying deflection voltages to a bonded pair of piezo-ceramic elements that are aligned in opposite poling directions, such that the polarities are in the poling direction of the elements to which they are applied. In the preferred embodiment of the present invention, a D.C. bias voltage is applied to each ceramic element in the poling direction of the element and an A.C. deflection voltage is superimposed on the D.C. bias voltage for controlling the deflection of the bimorph. The A.C. deflection voltage applied to one piezo-ceramic element is oppositely phased relative to the other element and the magnitude of D.C. bias voltage is chosen to insure that the net voltage, i.e., the sum of the D.C. bias voltage and the instantaneous A.C. deflection voltage, applied to an element always has a polarity in the poling direction of that element.

It should be apparent from the following description that the present invention is useful in many types of applications, particularly the environment of helical scan recorders and floppy disc apparatus and the like. While the embodiment of the invention specifically shown and described herein involves an elongated bendable bimorph that carries a transducing head on the outer free end thereof with the other end being firmly mounted, as does occur in one embodiment of a helical videotape recorder in which the invention may be used, it should be understood that the scope of the present invention should not be limited to such helical recorders. While the drawings do not specifically illustrate a videotape recording apparatus in which the bimorph assembly can be used, reference is made to the Ravizza, U.S. Pat. No. 4,106,065, wherein a rotary scanning drum of a helical recorder is shown and described which incorporates a deflectable magnetic transducer assembly of the type that is schematically illustrated herein. The specification of that Ravizza patent is specifically incorporated by reference herein.

Turning now to the drawings and particularly FIG. 1, one embodiment of the present invention is shown to include an elongated deflectable bimorph assembly, indicated generally at 10, which comprises a number of layers that are bonded together and act as a piezoelectric motor. More particularly, the bimorph assembly 10 includes a top piezo-ceramic element or layer 12, a bottom piezo-ceramic element or layer 14 and an intermediate electrically conductive substrate 16 which is bonded between the upper and lower elements 12 and 14. The substrate 16 limits the movement of the bimorph to a bending motion in response to electric potential that is applied.

To impress an electrical potential on the elements 12 and 14, conductive layers 18 and 20 are provided and cover the exposed surfaces of the elements. The assembly 10 is shown to be supported at its left end by the diagrammatic support 22 and is cantilevered therefrom, with the opposite free end carrying a transducer 25, the electrical connections of which are not shown but which extend to the circuitry associated with reproducing signals from and recording signals on the magnetic videotape medium.

To impress an electrical deflection potential on the elements 12 and 14, a voltage is applied to lines 24 and 26, with line 24 being connected to the layer 18 and line 26 connected to the layer 20. The substrate 16 between the elements 12 and 14 is shown to have a ground connection 28. The potentials applied through lines 24 and 26 relative to the ground potential on substrate 16 produce the desired deflection of the assembly 10.

As previously mentioned, the direction in which the bimorph assembly deflects depends on the polarity of the voltage applied to it and upon the poling direction of the pair of piezo-ceramic elements. The poling direction of a piezo-ceramic element is established by being initially subjected to a unidirectional field which polarizes the element according to the direction of the field. The polarized piezo-ceramic element is then said to have a "poling direction" and thereafter exhibits unique mechanical properties when subjected to subsequently applied voltages. Arrows 30 and 32 of FIG. 1 are intended to indicate the poling direction of the elements 12 and 14, respectively.

Turning now to FIG. 2 which schematically illustrates a bimorph assembly 40 that comprises a pair of piezo-ceramic elements 42 and 44 that are bonded to a substrate 46 in a manner substantially similar to the assembly 10 shown in FIG. 1 and which is also anchored to a support 48 and is deflected by the application of biasing voltage via lines 50, 52 and 54. The deflection of the assembly 40 will be described in accordance with the method and structure described in the aforementioned Ravizza U.S. Pat. No. 4,106,065, which is illustrative of the most recent prior art, the Ravizza method being a significant improvement over prior deflection voltage driving methods. The piezo-ceramic elements shown in FIG. 2 differ from those of FIG. 1 in that both elements 42 and 44 have a common poling direction, i.e., the poling direction illustrated by the arrows 56 and 58 being in the same direction as contrasted with opposite directions for those shown in the assembly of FIG. 1.

With respect to the details of the structure shown in FIG. 2, bias voltage sources 60 and 62 are disposed for providing an additive D.C. voltage to an alternating signal or A. C. deflection voltage supplied by a source 64. In particular, the bias voltage source 60 is coupled between the source 64 and the input of an amplifier 66, with the output of the amplifier 66 being coupled to the element 42 by means of the line 50. The bias voltage source 62 is coupled between the source 64 and the input of an amplifier 68, with the output of the amplifier being coupled to the element 44 by means of the line 52.

Deflection voltages are applied to the elements 42 and 44 such that the polarity of the applied voltage is always in the poling direction of the element to which it is applied so that a large degree of deflection of the bimorph can be effected without depolarizing either of the piezo-ceramic elements. Accordingly, with the elements polarized as indicated by the arrows 56 and 58, the bias source 60 is coupled with its positive terminal in the direction of the element 42 and its negative terminal in the direction of the source 64. The bias source 62 is polarized in the opposite direction of the source 60 such that its negative terminal is in the direction of the element 44 and its positive terminal is in the direction of the source 64.

The sources 60 and 62 preferably generate positive and negative D.C. voltages having magnitudes equal to $\frac{1}{2} V_{max}$ where $V_{max}$ is the peak-to-peak amplitude of the largest deflection signal that will be applied to the respective elements 42 and 44. The elements 42 and 44 are thus oppositely "biased" to $\frac{1}{2} V_{max}$ and, in the absence of any other deflection voltage being applied, the bimorph 40 will experience no deflection. For effecting varying amounts of deflection of the bimorph, the A.C. deflection or variable voltage source 64 is coupled between the elements 42 and 44 through the D. C. sources 60 and 62 as well as through amplifiers 66 and 68. The peak-to-peak amplitude of the A.C. deflection voltage applied to elements 42 and 44 may not be greater than $V_{max}$ without applying to either element a net voltage of a polarity which is opposed to the poling direction of that element. When the deflection voltage from the source 64 varies generally sinusoidally, the net voltage which appears across the element 42 is indicated in the upper half of the graph shown in FIG. 3 and the net voltage on the element 44 is illustrated in the lower half of the graph. With the elements 42 and 44 oppositely biased at $\frac{1}{2} V_{max}$ and the superimposed A.C. deflection signal applied to each of the elements, the net voltage across each of the elements 42 and 44 always has a polarity which is in the poling direction of the element. The curves labeled "deflection" in FIG. 3 indicate that the bimorph 40 deflects in accordance with two times the instantaneous amplitude of the A.C. deflection voltage applied by the source 64. When the net voltage on element 42 becomes more (or less) positive than about 178 $V_{max}$, the net amplitude of the voltage on element 44 becomes less (or more) negative correspondingly. However, because of the bias provided by the voltage source 62, the net voltage on the element 44 will always be in the poling direction as long as the peak-to peak magnitude of the A.C. deflection voltage does not exceed $V_{max}$.

It should be appreciated from the schematic diagram of FIG. 2 that a positive as well as negative power supply is required to provide the proper bias for the two elements 42 and 44 of the bimorph, when the poling directions of the bimorphs are the same.

In accordance with the present invention, only one power supply is needed for the reason that the bimorph elements 12 and 14 have their poling directions opposed to one another as has been previously explained and which is denoted by the arrows 30 and 32 of the bimorph assembly 10 shown in FIG. 1. When the poling directions are opposed as shown, a single biasing source can be utilized, which significantly reduces circuit expense. More specifically, the apparatus of FIG. 1 has a single D.C. biasing source 70 having its negative terminal connected via line 74 to summing junctions 76 and 77 which in turn are connected to respective inverting inputs of amplifiers 78 and 80 whose outputs are connected to lines 24 and 26, respectively. The positive terminal of the D.C. biasing source 70 is coupled to ground potential. An A.C. deflection source 82 is connected via lines 84 and 86 to a minus 1 or inverting amplifier 88 which changes the phase of the signal produced by the source 82 applied to the non-inverting input of the amplifier 78 via line 90. The source 82 is directly connected to the non-inverting input of the amplifier 80 via lines 84 and 92. A feedback resistor 79 is coupled between the output of the amplifier 78 and the summing junction 76. Similarly, a feedback resistor 81 is coupled between the output of the amplifier 80 and the summing junction 77.

Assuming that the A.C. deflection source 82 generates a sinusoidal signal which appears on output line 84, the voltage waveform that appears at the output of the amplifier 80 will be in the shape of the waveform 94 shown in FIG. 4. The signal is also inverted by the minus 1 amplifier 88 so that an inverted signal appears on line 24 at the output of the amplifier 78, and this inverted signal is shown by the waveform 96 in FIG. 4.

Since the summing junctions are coupled to the inverting inputs of the amplifiers 78 and 80, a composite or net voltage is applied to the respective elements 12 and 14 in a manner whereby a negative voltage never appears on either of the elements which is illustrated by the curves of FIG. 4. The D.C. bias voltage level is preferably set at $\frac{1}{2}$ of the maximum voltage and the A.C. deflection source 82 preferably has a maximum voltage which equals the D.C. bias voltage so that when it is in the positive direction, the voltage applied to a piezo-ceramic element may reach the maximum voltage. Also, when the deflection source voltage is negative relative to the D.C. bias voltage, the composite voltage can be reduced to about zero. It is noted that all the indicated polarities can be reversed to accomplish the same results.

By using the minus 1 amplifier 88, the waveform of the A.C. deflection appearing at summing junction 76 is always opposite to that appearing at summing junction 77 and the deflection or bending of the bimorph can thereby be achieved. Assuming that the A.C. deflection source voltage is at a level shown at location A on the graph of FIG. 4, it is seen that the voltage of curve 94 which is applied to element 14, is at maximum voltage whereas the curve 96 (representing the voltage applied to element 12) is at approximately zero voltage. Since the maximum voltage is applied to the lower bimorph in the poling direction, the bimorph will bend upwardly as viewed in FIG. 1. Similarly, if the voltages are as shown at location B in FIG. 4, i.e., maximum voltage being applied to the piezo-ceramic element 12 illustrated by curve 96 and approximately zero voltage applied to the lower element 14 as shown by curve 94, a positive voltage will be applied in the poling direction of piezo-ceramic element 12 and the bimorph will deflect downwardly. When no deflection is wanted, the A.C. deflection voltage will be zero as shown by location C and equal D.C. biasing voltages will be applied to each piezo-ceramic element.

It should be appreciated that the source 82 has been described herein as having a sinusoidal output waveform only for the purposes of describing the operation of the drive circuitry. The source may actually comprise extensive circuitry that develops a deflection signal that maintains the transducer on a desired path, such as tracking a recorded track or along a predetermined path during recording, for example.

Specific circuitry which can be used to carry out the operation shown by the block diagram of FIG. 1 is shown in FIG. 5 and has the A.C. deflection signal applied via line 84 from suitable circuitry which is not part of the present invention. The minus 1 amplifier 88 comprises the operational amplifier 100 together with resistors 102 and 104 and operates to provide minus 1 gain, i.e., effectively providing the opposite phase at the output line 90 as compared to the signal at the input on lines 84 and 92, the latter of which extends to the amplifier 80. Amplifiers 78 and 80 are substantially similar in their operation and comprise a differential input transistor pair 106 and 108, with transistor 110 providing a current source bias for the differential pair. Transistor 112 provides a current bias for the transistor 108 whih provides an amplifying stage. Transistors 114 and 116 are push-pull class B emitter followers which are used for amplifying the current for driving the bimorph which is a capacitive load. The resistor 79 is a feedback resistor that is used to stabilize the gain of the amplifier. The amplifiers 78 and 80 preferably have a gain of about 10, given the voltages shown in FIG. 4 when the bimorph requires maximum deflecting voltages of about 200 volts to obtain the large scale deflection.

From the foregoing description, it should be appreciated that an improved drive circuitry has been described for driving a bimorph having a pair of piezo-ceramic elements which produces large scale deflection of the bimorph without incurring any damaging depolarizing effects which result from applying voltages that are opposite the poling direction of the piezo-ceramic elements of the bimorph. A single power supply can be used with the present invention since the D.C. bias voltage need only be of a single polarity. The circuitry has many practical applications and is particularly adapted for use in an automatic scan tracking system of a videotape recorder, as well as other apparatus which require large scale bidirectional deflection of a bimorph.

It should also be understood that many alternatives, modifications and variations in the specific embodiments described herein will be apparent to those skilled in the art. Accordingly, the present invention is intended to include all such alternatives, modifications and variations which fall within the spirit and scope of the invention as defined by the appended claims and the equivalents thereof.

Various features of the invention are set forth in the following claims.

What is claimed is:

1. A piezoelectric bimorph and driver therefor comprising:
    a bimorph having a pair of electrically poled piezo-ceramic elements aligned in opposite poling directions relative to one another and bonded to a common substrate between said elements, the bonded pair of elements having a cantilevered end and an opposed end which is free to deflect;
    means for applying a D.C. bias voltage of the same polarity between each of said piezo-ceramic elements and said substrate, the polarity of the applied bias voltage being in the poling direction of the piezo-ceramic element to which it is applied; and
    means for applying an A.C. deflection voltage between said substrate and each of said piezo-ceramic elements so that the A.C. deflection voltage is superimposed on the D.C. bias voltages for controlling the deflection of the bimorph, the magnitudes of the D.C. bias voltages being large enough so that the net voltage applied to each piezo-ceramic element has a polarity which is in the poling direction of that element, the A.C. deflection voltage applied to one of said elements being the inverse of the voltage applied to the other element.

2. A piezoelectric bimorph and driver therefor as set forth in claim 1 wherein the D.C. bias voltages applied to the piezo-ceramic elements are of substantially equal magnitudes.

3. A deflectable transducer system for recording and/or reproducing information along a track of a recording medium comprising:
    a piezoelectric bimorph comprising a pair of electrically poled piezo-ceramic elements bonded together and aligned in opposite poling directions, the bonded pair of piezo-ceramic elements having a common cantilevered end and a common opposed end which is free to deflect;
    a transducer mounted at the deflectable end of said bimorph for transducing information with respect to said recording medium; and,
    means for applying deflection voltages to each piezo-ceramic element, said deflection voltages having a polarity which is in the poling direction of the piezo-ceramic element to which it is applied, whereby a large degree of deflection of the bimorph can be effected without depolarizing either piezo-ceramic element, said deflection voltages including a D.C. bias voltage applied to each piezo-ceramic element and an A.C. deflection voltage applied to each element and superimposed on the D.C. bias voltage for controlling deflection of the bimorph, the polarity of the D.C. bias voltage applied to each element being the same and in the poling direction of each element, the magnitudes of the D.C. bias voltages being sufficiently large that the net voltage applied to each piezo-ceramic element has a polarity which is in the poling direction of that element.

4. A deflectable transducer system as set forth in claim 3 wherein said piezo-ceramic elements are bonded to a common substrate, wherein substantially equal D.C. bias voltages are applied between the substrate and each piezo-ceramic element, and whereby the A.C. deflection voltage is applied between the substrate and each of said piezo-ceramic elements, the A.C. deflection voltage applied to one of said elements being inverted relative to that applied to the other of said elements.

5. A deflectable transducer system for recording and/or reproducing information along a track of a recording medium, comprising:
    a piezoelectric bimorph having a pair of electrically poled piezo-ceramic elements aligned in opposite poling directions and bonded to a common substrate between said piezo-ceramic elements, the bonded pair of elements having a common cantilevered end and a common opposed end which is free to deflect;
    a transducer mounted on the deflectable end of said bimorph for transducing information with respect to said recording medium;
    means for applying a D.C. bias voltage of the same polarity between each of said piezo-ceramic elements and said substrate such that the polarity of the applied bias voltage is in the poling direction of the piezo-ceramic element to which it is applied; and,
    means for applying an A.C. deflection voltage between said substrate and each of said piezo-ceramic elements so that the A.C. deflection voltage is superimposed on said D.C. bias voltage for controlling the deflection of the bimorph, the magnitude of the D.C. bias voltage being so large that the net voltage applied to each piezo-ceramic element has a polarity which is in the poling direction of that element, the A.C. deflection voltage applied to one element being of opposite phase relative to the A.C. deflection voltage applied to the other element.

6. A deflectable transducer system as set forth in claim 5 wherein the D.C. bias voltages applied to the piezo-ceramic elements are of substantially equal magnitudes.

7. A piezoelectric bimorph and driver for the same, comprising:
    a bimorph having a pair of electrically poled piezo-ceramic elements bonded to a common conductive substrate located therebetween, the poling directions of said elements being opposed to one another, said bimorph being mounted at one end portion and the remainder thereof being free for deflecting movement upon application of deflecting voltage thereto; and means for applying a net deflecting voltage between each element and said substrate of such polarity that deflecting movement of said bimorph in either direction can be produced without applying to either element a voltage in a direction tending to depolarize either of said elements, said net voltage applied to one element comprising a D.C. voltage and an A.C. voltage, the net voltage applied to the other element comprising a D.C. voltage and an A.C. voltage that is phase inverted relative to the A.C. voltage applied to said one element, the D.C. voltage applied to each element of the same polarity in the poling direction of the respective elements.

8. A piezoelectric bimorph and driver for the same, comprising:

a bimorph having a pair of electrically poled piezo-ceramic elements bonded to a common conductive substrate located therebetween, the poling directions of said elements being opposed to one another, said bimorph being mounted at one end portion and the remainder thereof being free for deflecting movement upon application of deflecting voltage thereto; and means for applying a net deflecting voltage between each element and said substrate of such polarity that deflecting movement of said bimorph in either direction can be produced without applying to either element a voltage in a direction tending to depolarize either of said elements, said net voltage applied to one element comprising a positive D.C. voltage and an A.C. voltage, the net voltage applied to the other element comprising a positive D.C. voltage and an A.C. voltage that is phase inverted relative to the A.C. voltage applied to said one element.

9. A method of driving a cantilevered piezoelectric bimorph having a pair of electrically poled piezo-ceramic elements aligned in opposite poling directions and bonded to a common substrate between said elements, comprising:

applying deflection voltages to each piezo-ceramic element such that the polarity of the voltage applied to each element is in the poling direction of the element to which it is applied, whereby a large degree of deflection of the bimorph can be effected without depolarizing either piezo-ceramic element, said deflection voltages including a D.C. bias voltage of the same polarity applied to each piezo-ceramic element in the poling direction of the piezo-ceramic element and an A.C. deflecting voltage superimposed on the D.C. bias voltage applied to each element for controlling deflection of the bimorph, the magnitudes of the D.C. bias voltages being sufficiently large that the net voltage applied to each piezo-ceramic element has a polarity which is in the poling direction of that element.

10. A method as set forth in claim 9, including applying substantially equal D.C. bias voltages between the substrate and each piezo-ceramic element.

11. A method as set forth in claim 10 wherein the A.C. deflection voltage is applied between the substrate and each of said piezo-ceramic elements, the A.C. deflection voltage of one element being phase inverted relative to the A.C. deflection voltage applied to the other element.

* * * * *